(12) United States Patent
Chang et al.

(10) Patent No.: US 7,911,267 B2
(45) Date of Patent: Mar. 22, 2011

(54) SIGMA-DELTA CLASS-D AMPLIFIER AND CONTROL METHOD FOR A SIGMA-DELTA CLASS-D AMPLIFIER

(75) Inventors: Teng-Hung Chang, Kaohsiung (TW); Jwin-Yen Guo, Zhubei (TW)

(73) Assignee: Richtek Technology Corp., Hsinchu (TW)

( * ) Notice: Subject to any disclaimer, the term of this patent is extended or adjusted under 35 U.S.C. 154(b) by 26 days.

(21) Appl. No.: 12/230,648

(22) Filed: Sep. 3, 2008

(65) Prior Publication Data

US 2009/0072897 A1  Mar. 19, 2009

(30) Foreign Application Priority Data

Sep. 13, 2007  (TW) .............................. 96134299 A

(51) Int. Cl.
*H03F 3/38* (2006.01)
(52) U.S. Cl. ........................................................ 330/10

(58) Field of Classification Search .................... 330/10, 330/207 A, 251; 375/238–239
See application file for complete search history.

(56) References Cited

U.S. PATENT DOCUMENTS 7,330,069 B2 *  2/2008  Yamamura et al. ............. 330/10

* cited by examiner

*Primary Examiner* — Robert Pascal
*Assistant Examiner* — Khiem D Nguyen
(74) *Attorney, Agent, or Firm* — Rosenberg, Klein & Lee

(57) ABSTRACT

A sigma-delta class-D amplifier includes a quantizer to quantize an input to produce a digital signal, and an output stage to produce an output according to the digital signal. The quantizer has a smaller step size so that the digital signal has at least five logical levels, and the sigma-delta class-D amplifier is thus improved to have wider stable modulation range and less switching loss.

10 Claims, 6 Drawing Sheets

US 7,911,267 B2

SIGMA-DELTA CLASS-D AMPLIFIER AND CONTROL METHOD FOR A SIGMA-DELTA CLASS-D AMPLIFIER

FIELD OF THE INVENTION

The present invention is related generally to a power amplifier and, more particularly, to a sigma-delta class-D amplifier and a control method for a sigma-delta class-D amplifier.

BACKGROUND OF THE INVENTION

Class-D amplifiers may be categorized into pulse width modulation (PWM) type and sigma-delta (ΣΔ) modulation type, and the ΣΔ-based class-D amplifiers may be further categorized into 1-bit ΣΔ class-D amplifier and 1.5-bit ΣΔ class-D amplifier, where the terms "1-bit" and "1.5-bit" represent the degrees of quantization, or otherwise called "resolution". More specifically, "1-bit" means that the input of the ΣΔ class-D amplifier is quantized into two logical levels, such as '0' and '1', and "1.5-bit" means that the input of the ΣΔ class-D amplifier is quantized into three logical levels, such as '−1', '0' and '1'. FIG. 1 is a block diagram of a conventional 1-bit ΣΔ class-D amplifier 100, which includes a filter 102 to filter an input consisting of signals VINP and VINN opposite in phase to each other to produce signals SOP and SON, a 1-bit quantizer 104 to quantize the signals SOP and SON to produce a digital signal consisting of signals QuP and QuN, and a switching logic 106 to drive a power stage 108 to produce an output Vout for a load according to the signals QuP and QuN produced by the quantizer 104. The output Vout of the ΣΔ class-D amplifier 100 is the difference between two voltages OUTP and OUTN produced by the output stage 108. For better signal-to-noise ratio (SNR), the sigma-delta modulation scheme further includes a feedback mechanism to feed back the voltages OUTP and OUTN in the output stage 108 to the filter 102. The class-D amplifier with 1-bit sigma-delta modulation (ΣΔ-based class-D amplifier) has good SNR compared to that with pulse width modulation, but suffers from instability and high switching loss.

Specifically, a conventional 1-bit ΣΔ modulator is only stable to 50% modulation, which greatly limits the maximum output power to 0.25× of theoretical full-scale. This is because the output Vout from the 1-bit ΣΔ class-D amplifier 100 has only two voltage levels, say +5V and −5V, so that a minimum voltage variation fed back to its input is 10V. This will cause significant increase of the input of the filter 102, leading to abnormal operation of the filter 102 due to saturation thereof. Consequently, the SNR is lowered.

In addition, at least 64× oversampling is need for a conventional 1-bit ΣΔ class-D amplifier to achieve sufficient audio-band SNR, so the typical output data rate is higher than 2 MHz, which increases the switching loss and degrades the power efficiency. For more details on ΣΔ class-D amplifiers, readers are referred to U.S. Pat. Nos. 7,170,340, 6,724,830 and 6,472,933.

Therefore, it is desired a more stable and less switching loss ΣΔ class-D amplifier.

SUMMARY OF THE INVENTION

The present invention is directed to a ΣΔ-based class-D amplifier by using an "at least five logical levels bit quantization scheme" to improve the stability and reduce the output data rate thereof.

According to the present invention, a sigma-delta class-D amplifier comprises a quantizer with a smaller step size for quantizing an input into a digital signal of at least five logical levels, and a power stage for providing an output for a load according to the digital signal. The voltage level of the output varies with the logical level of the digital signal. In an embodiment, the power stage includes at least two independent power supplies and a plurality of power switches, and each of the power supplies and four of the power switches are configured together with the load to be an H-bridge circuit.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
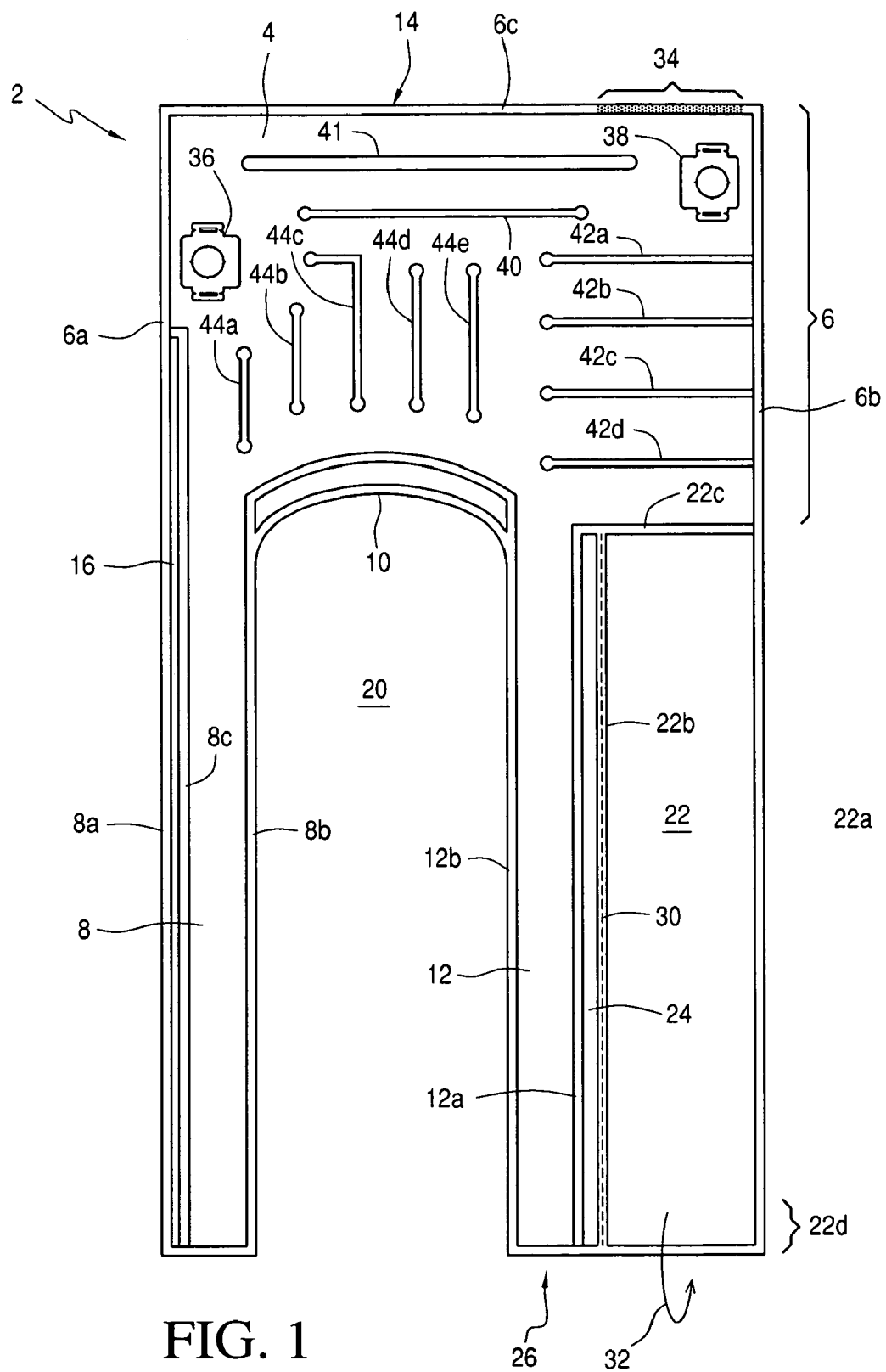
FIG. 1 is a block diagram of a conventional 1-bit ΣΔ class-D amplifier.
Figure 2:
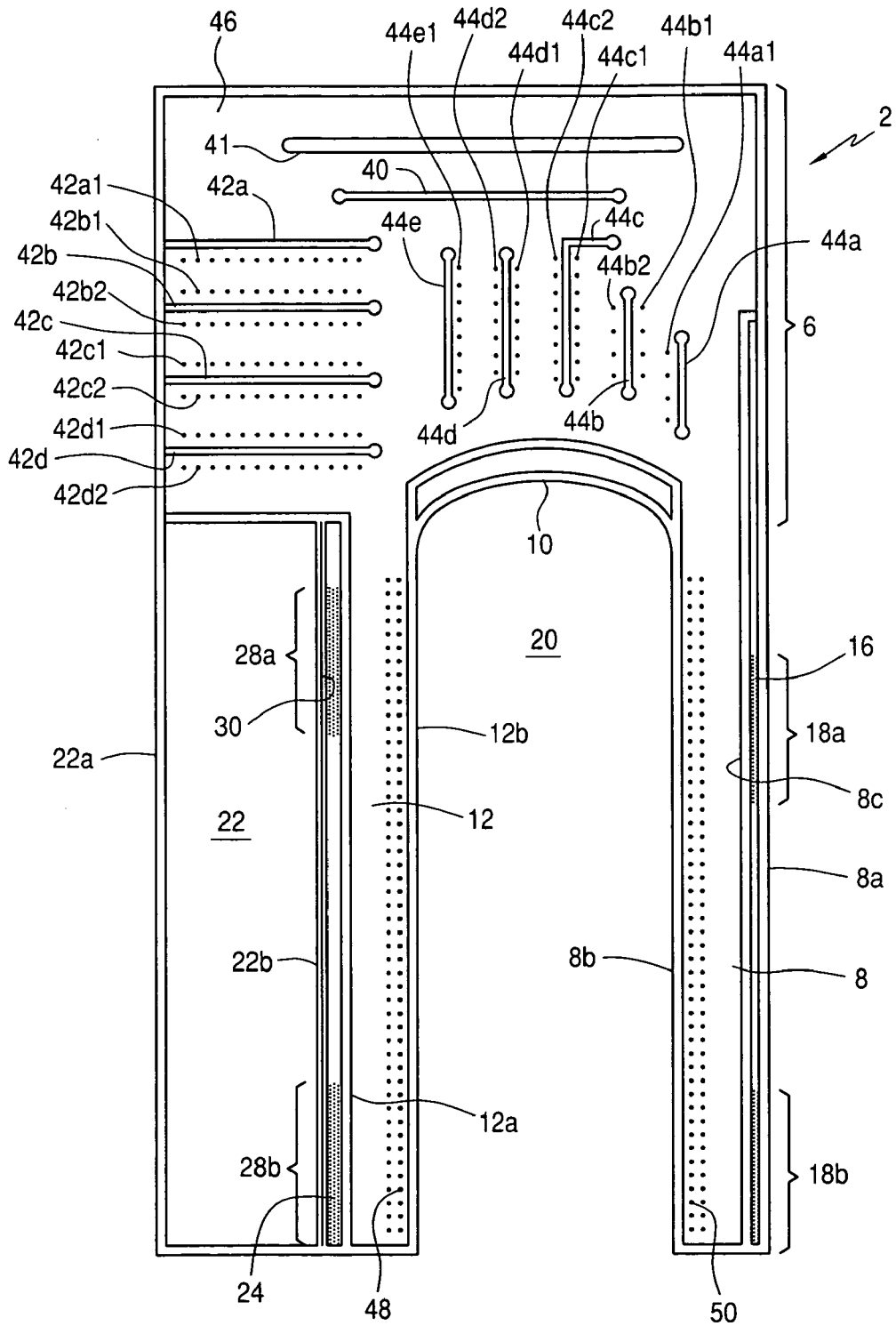
FIG. 2 is a block diagram of a 2.5-bit ΣΔ class-D amplifier according to the present invention.

FIG. 2 is a block diagram of a third-order 2.5-bit ΣΔ class-D amplifier 200 according to the present invention, in which a filter 202 includes three serially coupled integrators 20202 to convert an input consisting of opposite-phase signals VINP and VINN into signals SOP and SON, the integrators 20202 can be of continuous-time or discrete-time types, and a 2.5-bit quantizer 204 quantizes the signals SOP and SON into a digital signal consisting of signals QuP and QuN each having one of five logical levels, for example +2, +1, 0, −1 and −2. Since the signals VINP and VINN have opposite phases to each other, the signals QuP and QuN also have opposite phases to each other. According to the output QuP and QuN of the 2.5-bit quantizer 204, a switching logic 206 drives a power stage 208 to produce an output Vout for a load 210. The output Vout is the difference between two voltages OUTP and OUTN produced by the output stage 208 and is fed back to the filter 202. The voltage level of the output Vout varies with the logical level of the signals QuP and QuN. For instance, the output Vout is +5V when the signal QuP is +2; the output Vout is +2.5V when the signal QuP is +1; the output Vout is 0V when the signal QuP is 0; the output Vout is −2.5V when the signal QuP is −1; and the output Vout is −5V when the signal QuP is −2. In this embodiment, the ΣΔ class-D amplifier 200 is a third-order one, so that the filter 202 includes three integrators 20202. In other embodiments, for example a fourth-order ΣΔ class-D amplifier, the filter 202 will have four integrators 20202.

It is known that the in-band noise power for an $L^{th}$-order sigma-delta modulator is approximately $$q^2_{rms} \approx (\pi^{2L}\Delta^2)/[12\times(2L+1)\times(OSR)^{2L+1}], \qquad [\text{Eq-1}]$$

where $\Delta$ is the step size of quantization and OSR is the oversampling rate. Obviously, three parameters, $\Delta$, L and OSR, can be used to reduce the in-band noise power. The SNR increases as the in-band noise power decreases. For conventional 1-bit or 1.5-bit quantization, the step size Δ is large and the modulator thus requires high-order, high-OSR architecture to achieve desired SNR. However, the higher the order L of the modulator is, the easier the modulator becomes instable, which limits the maximum output power. The use of 2.5-bit quantization (five logical levels) can improve the stable range to 70%-90% of modulation (i.e. the input is 70%-90% of the output), which enhances the maximum output power. Moreover, since the step size Δ of 2.5-bit quantization is smaller than that of 1-bit or 1.5-bit quantization, the in-band noise power of $L^{th}$-order ΣΔ modulator with 2.5-bit quantization can be reduced. Thus, the desired SNR of the modulator can be achieved with lower OSR. This, in turn, reduces the output data rate and switching loss.

Figure 3:
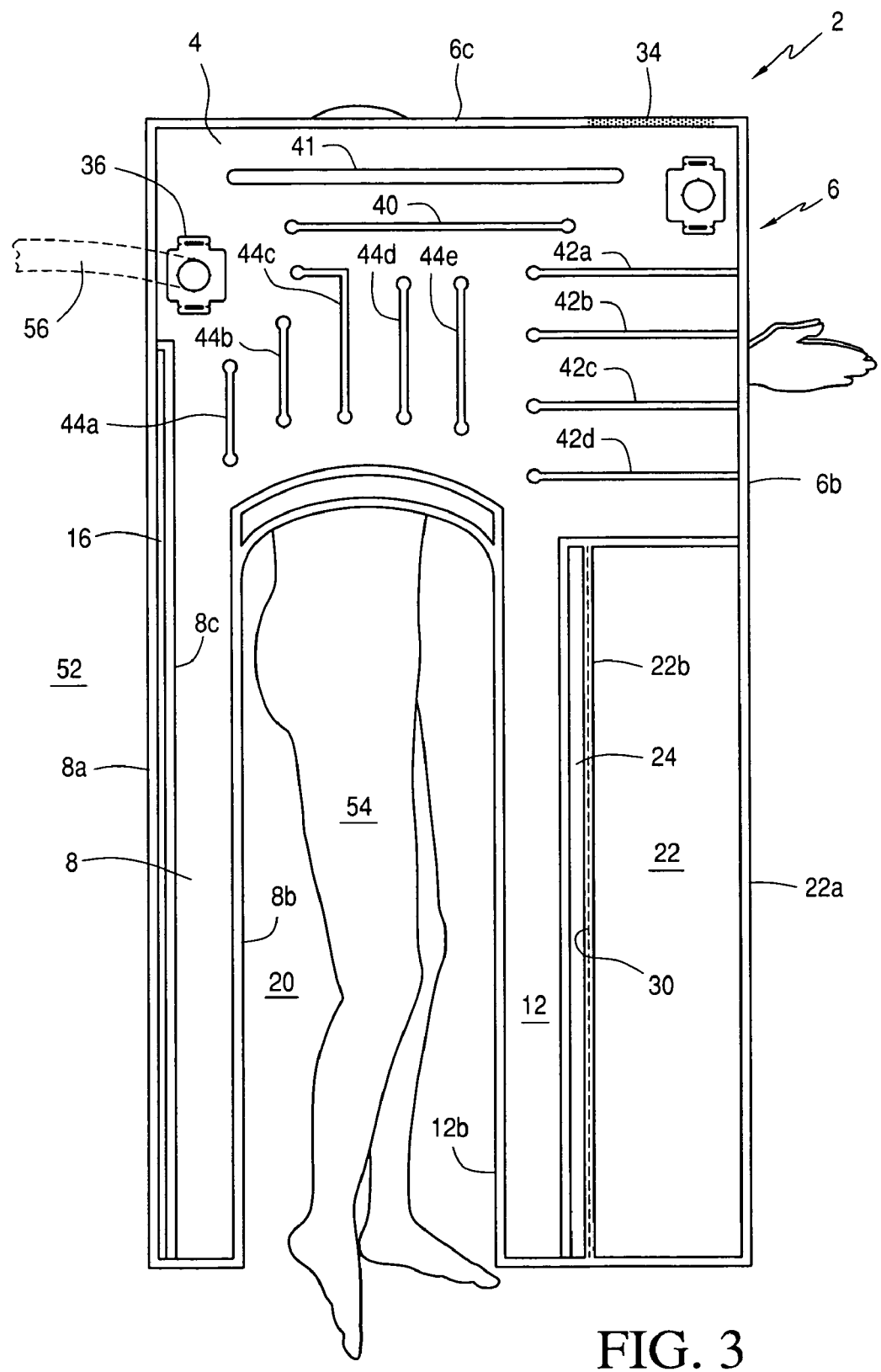
FIG. 3 is an embodiment for the power stage in the amplifier of FIG. 2.

FIG. 3 provides an embodiment for the power stage 208 in the circuit of FIG. 2, which is a dual-supply H bridge circuit and contains six power transistors 20802, 20804, 20806, 20808, 20810 and 20812 and two independent power supplies Vdd1 and Vdd2. The power supply Vdd1 provides a higher voltage and the power supply Vdd2 provides a lower voltage. The transistor 20802 is coupled between the power supply Vdd1 and a positive output node OUTP; the transistor 20804 is coupled between the power supply Vdd2 and the positive output node OUTP; the transistor 20806 is coupled between the power supply Vdd2 and a negative output node OUTN; the transistor 20808 is coupled between the power supply Vdd1 and the negative output node OUTN; the transistor 20810 is coupled between the positive output node OUTP and a ground node GND; and the transistor 20812 is coupled between the negative output node OUTN and the ground node GND. As shown in FIG. 3, the power supply Vdd1, the transistors 20802, 20808, 20810 and 20812 and the load 210 are configured to be an H-bridge circuit, and the power supply Vdd2, the transistors 20804, 20806, 20810 and 20812 and the load 210 are configured to be another H-bridge circuit.

Figure 4:
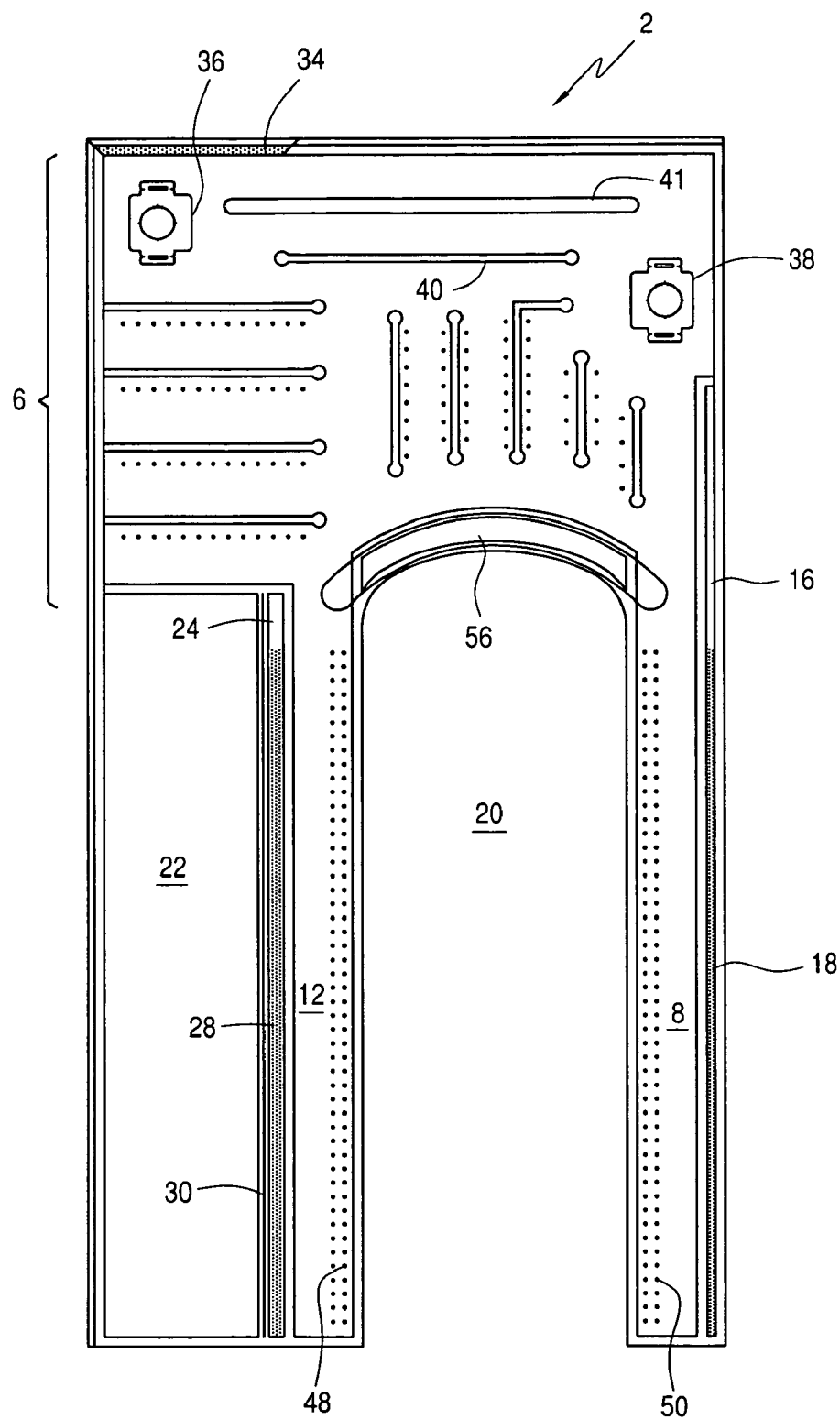
FIG. 4 is a diagram to illustrate the operations of the power stage shown in FIG. 3.

FIG. 4 is a diagram to illustrate the operations of the power stage 208 shown in FIG. 3. Assuming that the signals SOP and SON are quantized by the 2.5-bit quantizer 204 into the signals QuP and QuN of five logical levels, +2, +1, 0, −1 and −2, when the signal QuP is +2, the transistors 20802 and 20812 in the power stage 208 are turned on, so that the positive output node OUTP is connected to the power supply Vdd1 and the negative output node OUTN is grounded. Therefore, the voltage across the load 210 is +Vdd1. When the signal QuP is +1, the transistors 20804 and 20812 in the power stage 208 are turned on, so that the positive output node OUTP is connected to the power supply Vdd2 and the negative output node OUTN is grounded. As a result, the voltage across the load 210 is +Vdd2. When the QuP is 0, the transistors 20810 and 20812 in the power stage 208 are turned on, thereby having both the positive and negative output nodes OUTP and OUTN grounded and the voltage across the load 210 to be zero. When the signal QuP is −1, the transistors 20806 and 20810 in the power stage 208 are turned on to ground the positive output node OUTP and connect the negative output node OUTN to the power supply Vdd2. Consequently, the voltage across the load 210 is −Vdd2. When the signal QuP is −2, the transistors 20808 and 20810 in the power stage 208 are turned on, thereby grounding the positive output node OUTP and connecting the negative output node OUTN to the power supply Vdd1. Thus, the voltage across the load 210 is −Vdd1.

Figure 5:
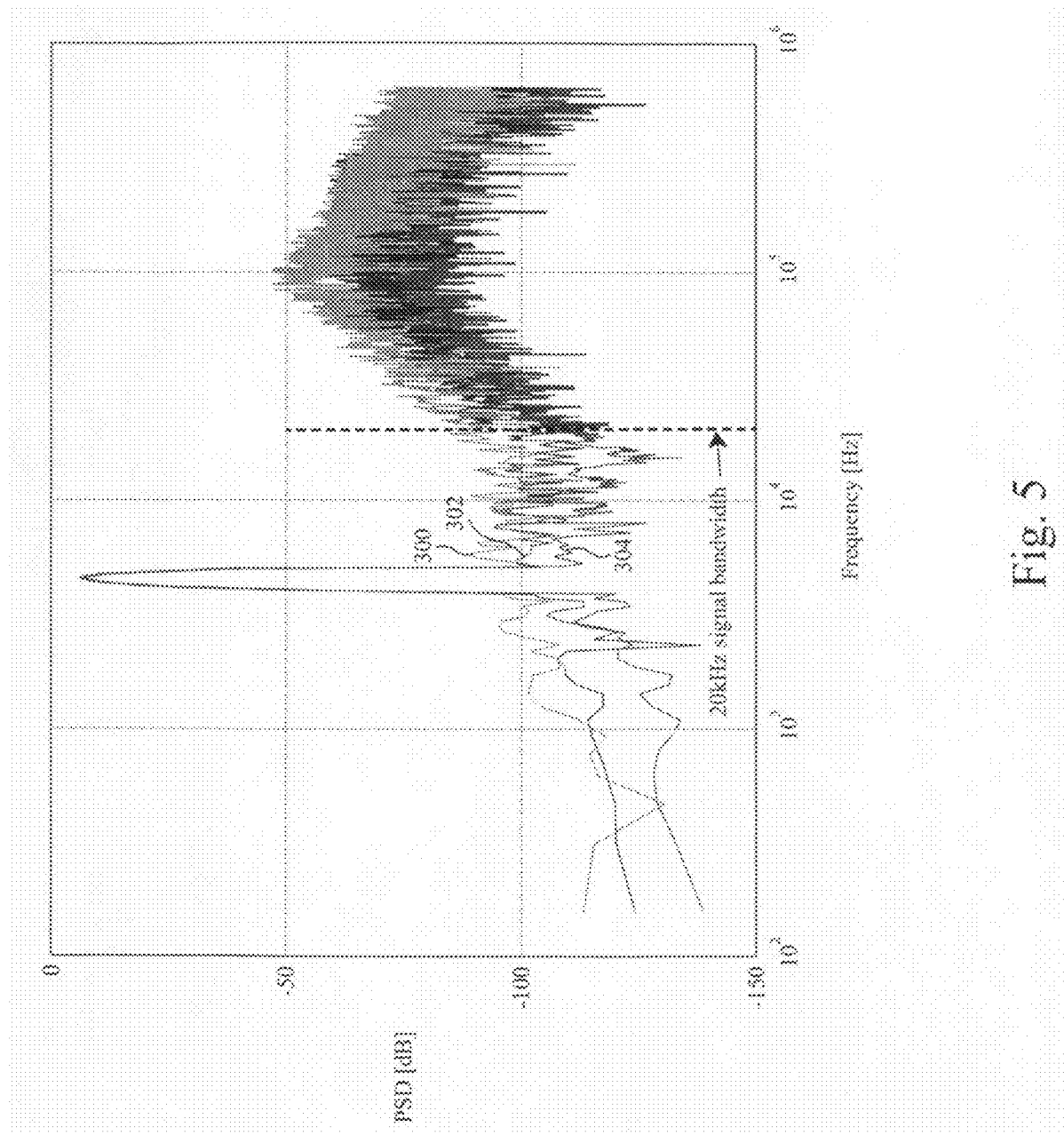
FIG. 5 is a simulated output spectrum of third-order 1-bit, 1.5-bit and 2.5-bit ΣΔ class-D amplifiers at 50% modulation.

FIG. 5 is a simulated output spectrum of third-order 1-bit, 1.5-bit and 2.5-bit ΣΔ class-D amplifiers at 50% modulation, in which curve 300 represents the output of a third-order 1-bit ΣΔ class-D amplifier, curve 302 represents the output of a third-order 1.5-bit ΣΔ class-D amplifier, and curve 304 represents the output of a third-order 2.5-bit ΣΔ class-D amplifier. As shown in FIG. 5, at 50% modulation, the third-order 2.5-bit ΣΔ class-D amplifier has a signal-to-noise plus distortion ratio (SNDR) of 90 dB and a total harmonic distortion+noise (THD+N) of approximately 0.003%. On the other hand, when the modulation rage is 50%, the third-order 1-bit ΣΔ class-D amplifier has an SNDR of about 70 dB and the third-order 1.5-bit ΣΔ class-D amplifier has an SNDR of about 80 dB.

Figure 6:
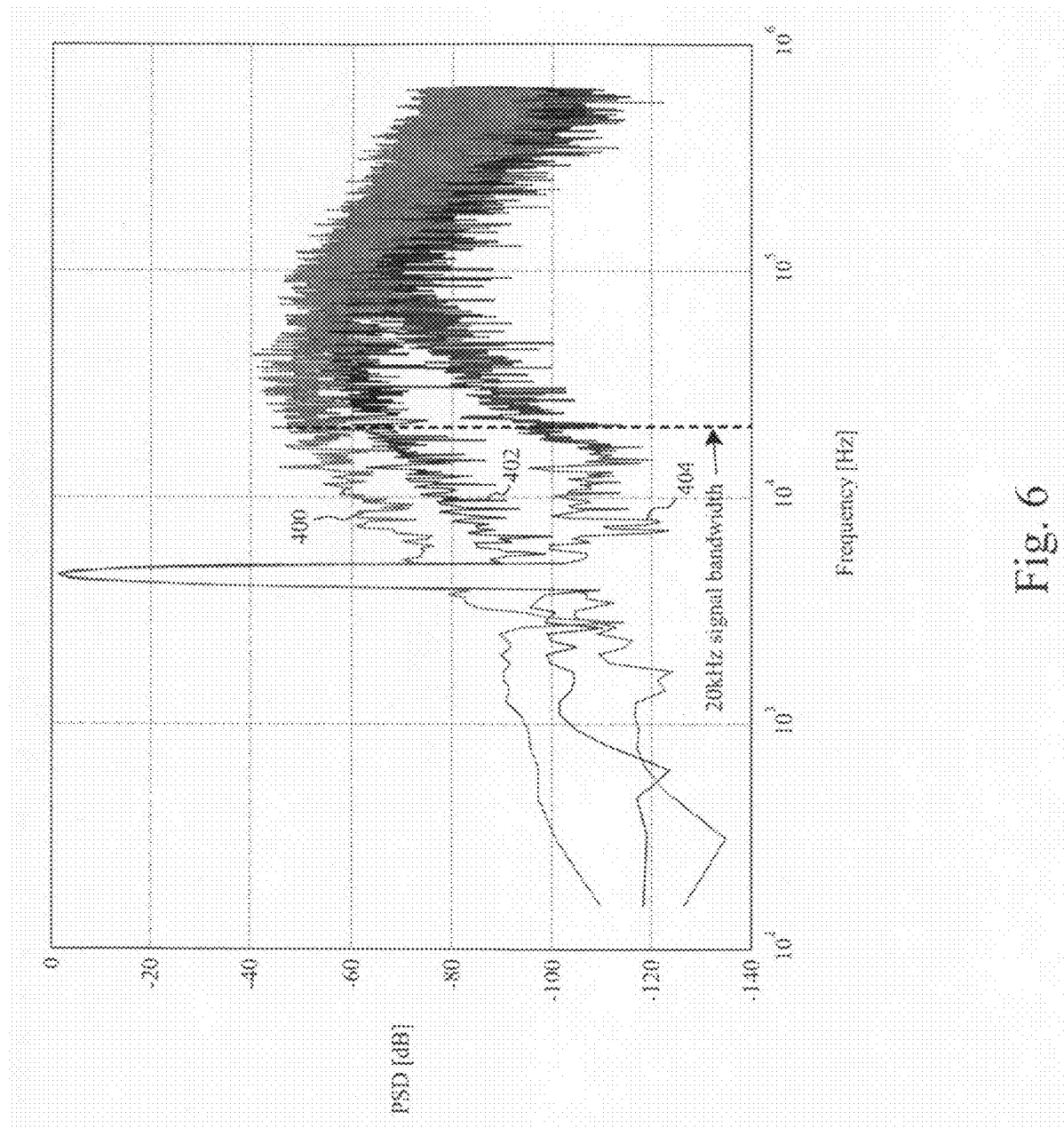
FIG. 6 is a simulated output spectrum of third-order 1-bit, 1.5-bit and 2.5-bit ΣΔ class-D amplifiers at 90% modulation.

FIG. 6 is a simulated output spectrum of third-order 1-bit, 1.5-bit and 2.5-bit ΣΔ class-D amplifiers at 90% modulation, in which curve 400 represents the output of a third-order 1-bit ΣΔ class-D amplifier, curve 402 represents the output of a third-order 1.5-bit ΣΔ class-D amplifier, and curve 404 represents the output of a third-order 2.5-bit ΣΔ class-D amplifier. As shown in FIG. 6, the third-order 2.5-bit ΣΔ class-D amplifier has an SNDR of 85 dB, the third-order 1-bit ΣΔ class-D amplifier has an SNDR of about 37 dB, and the third-order 1.5-bit ΣΔ class-D amplifier has an SNDR of about 53 dB. It is thus shown by FIGS. 5 and 6 that, when the modulation range is increased to 90%, the SNDR values of the 1-bit and 1.5-bit ΣΔ class-D amplifiers drop significantly. This is because a larger input amplitude will saturate the output of the integrator. In contrast, the 2.5-bit ΣΔ class-D amplifier only experiences a slight drop in SNDR, which means the 2.5-bit ΣΔ class-D amplifier remains highly efficient at 90% modulation.

According to the simulation results of a third-order 2.5-bit ΣΔ class-D amplifier, when the sampling rate is 1.28 MHz (at a 32-time oversampling rate), the third-order 2.5-bit ΣΔ class-D amplifier has an SNDR as high as 90 dB and a stable modulation rage thereof in the audio band (20 Hz-20 kHz) is increased to 90%. According to the further simulation results of a fourth-order 2.5-bit ΣΔ class-D amplifier, when the sampling rate is 1.28 MHz, the fourth-order 2.5-bit ΣΔ class-D amplifier has an SNDR as high as 110 dB and a stable modulation rage thereof in the audio band (20 Hz-20 kHz) is increased to 90%. Hence, the 2.5-bit ΣΔ class-D amplifier has better efficiency than the conventional 1-bit and 1.5-bit ΣΔ class-D amplifiers.

In other embodiment, the bit number of the quantizer 204 can be larger, for example by using a 3.5-bit quantizer. As the quantizer has more bits, the power stage 208 needs to be adjusted accordingly, for example by using more independent power supplies and power switches.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A sigma-delta class-D amplifier, comprising:
   a quantizer for quantizing an input to produce a digital signal of at least five logical levels; said input quantized using at least 2.5 bits; and
   a power stage operative in response to the digital signal for providing an output for a load; wherein each of the logical levels determines a respective one of at least five different voltage levels as the output.

2. The sigma-delta class-D amplifier of claim 1, wherein the output has a voltage level varying with the logical level of the digital signal.

3. The sigma-delta class-D amplifier of claim 2, wherein the voltage level of the output is one of at least five voltage levels.

4. The sigma-delta class-D amplifier of claim 1, wherein the power stage comprises at least two independent power supplies and a plurality of switches configured together with the load to be an H-bridge circuit.

5. The sigma-delta class-D amplifier of claim 1, further comprising a filter for filtering the input.

6. The sigma-delta class-D amplifier of claim 5, wherein the filter comprises at least one integrator.

7. The sigma-delta class-D amplifier of claim 6, wherein the at least one integrator is of a continuous-time type.

8. The sigma-delta class-D amplifier of claim 6, wherein the at least one integrator is of a discrete-time type.

9. A control method for a sigma-delta class-D amplifier, comprising the steps of:
   quantizing an input to produce a digital signal of at least five logical levels; wherein said input quantized using at least 2.5 bits; and
   producing an output varying with the logical level of the digital signal for a load; wherein each of the logical levels determines a respective one of at least five different voltage levels as the output.

10. The control method of claim 9, further comprising the step of filtering the input.

* * * * *